(12) United States Patent
Shan et al.

(10) Patent No.: US 12,095,460 B2
(45) Date of Patent: Sep. 17, 2024

(54) PROGRAMMABLE GATE ARRAY (FPGA) FOR REALIZING EXTERNAL MONITORING AND CONFIGURATION

(71) Applicant: WUXI ESIONTECH CO., LTD., Wuxi (CN)

(72) Inventors: Yueer Shan, Wuxi (CN); Zhengzhou Cao, Wuxi (CN); Wenhu Xie, Wuxi (CN); Yanfei Zhang, Wuxi (CN); Ting Jiang, Wuxi (CN); Bo Tu, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 232 days.

(21) Appl. No.: 17/955,578

(22) Filed: Sep. 29, 2022

(65) Prior Publication Data

US 2023/0020524 A1 Jan. 19, 2023

Related U.S. Application Data

(63) Continuation of application No. PCT/CN2022/102686, filed on Jun. 30, 2022.

(30) Foreign Application Priority Data

Dec. 17, 2021 (CN) .......................... 202111551554.7

(51) Int. Cl.
*H03K 19/20* (2006.01)
*H03K 19/17748* (2020.01)

(52) U.S. Cl.
CPC ....... *H03K 19/17748* (2013.01); *H03K 19/20* (2013.01)

(58) Field of Classification Search
CPC .......................... H03K 19/17748; H03K 19/20
See application file for complete search history.

(56) References Cited

U.S. PATENT DOCUMENTS 5,594,360 A * 1/1997 Wojciechowski .......................... G01R 19/16576
365/226
5,671,179 A * 9/1997 Javanifard ............. G11C 16/30
365/230.03

(Continued)

FOREIGN PATENT DOCUMENTS

| CN | 103730163 A | 4/2014 |
| CN | 104883051 A | 9/2015 |

(Continued)

OTHER PUBLICATIONS

Zhao Yicheng, et al., Research on FPGA Programming Principle Based on Flash Units, Microprocessors, 2018, pp. 14-19, No. 4.

*Primary Examiner* — Kurtis R Bahr
(74) *Attorney, Agent, or Firm* — Bayramoglu Law Offices LLC

(57) ABSTRACT

A configuration circuit of a flash FPGA for realizing external monitoring and configuration is provided. In the configuration circuit, a positive high-voltage output terminal of a positive high-voltage charge pump is connected to a positive high-voltage external monitoring port through a positive high-voltage bidirectional switch circuit, and the positive high-voltage output terminal of a positive high-voltage charge pump is further configured as a positive output end of a voltage supply circuit. A negative high-voltage output terminal of a negative high-voltage charge pump is connected to a negative high-voltage external monitoring port through a negative high-voltage bidirectional switch circuit, and the negative high-voltage output terminal of a negative high-voltage charge pump is further configured as a negative output end of the voltage supply circuit. Based on a received mode adjustment signal, a mode control circuit controls to enter an external monitoring mode or an external configuration mode.

10 Claims, 3 Drawing Sheets

(56) References Cited

U.S. PATENT DOCUMENTS

| | | | |
|---|---|---|---|
| 7,616,508 B1 | 11/2009 | Landry et al. | |
| 2007/0109876 A1* | 5/2007 | Umezawa | G11C 8/08 365/189.09 |
| 2009/0236500 A1* | 9/2009 | Shah | H04N 25/78 250/214 C |

FOREIGN PATENT DOCUMENTS

| | | |
|---|---|---|
| CN | 105515568 A | 4/2016 |
| CN | 111755436 A | 10/2020 |
| CN | 113625629 A | 11/2021 |
| CN | 114300019 A | 4/2022 |

* cited by examiner

PROGRAMMABLE GATE ARRAY (FPGA) FOR REALIZING EXTERNAL MONITORING AND CONFIGURATION

CROSS REFERENCE TO THE RELATED APPLICATIONS

This application is the continuation application of International Application No. PCT/CN2022/102686, filed on Jun. 30, 2022, which is based upon and claims priority to Chinese Patent Application No. 202111551554.7, filed on Dec. 17, 2021, the entire contents of which are incorporated herein by reference.

TECHNICAL FIELD

The present disclosure relates to the field of flash field programmable gate array (FPGA), and in particular, to a configuration circuit of a flash FPGA for realizing external monitoring and configuration.

BACKGROUND

A flash FPGA is designed based on a flash memory technology that can be repeatedly configured. A logic relationship inside a circuit is changed by reprogramming a flash cell to realize different logic functions for users. As a core of the flash FPGA, each programmable logic block contains m*n flash cell arrays, which are scattered in the whole flash FPGA as small blocks, as shown in FIG. 1.

In the process of developing the flash FPGA, configuration logic obtains a configuration code stream through a Joint Test Action Group (JTAG) protocol and uses a word line (WL) drive circuit and a bit line (BL) drive circuit to perform erasure, programming, and other operations on the flash cell in the programmable logic block. The flash FPGA has a very large chip area. Taking a flash FPGA with 3 million system equivalent gates and a 0.11 μm manufacturing process as an example, the chip area reaches 12 mm*15 mm, which is far greater than that of a flash memory with an equal capacity. Therefore, the WL drive circuit and the BL drive circuit of the flash cell have relatively long wiring and large load, which poses a challenge to reliability.

SUMMARY

Technical Problem

A WL drive circuit and a BL drive circuit of a flash cell have relatively long wiring and large load, which poses a challenge to reliability.

Solutions to the Problems

Technical Solutions

To resolve the above problems and meet the above technical requirements, the inventor proposed a configuration circuit of a flash FPGA for realizing external monitoring and configuration. The technical solutions of the present disclosure are as follows:

A configuration circuit of a flash FPGA for realizing external monitoring and configuration is provided. The flash FPGA includes a positive high-voltage external monitoring port and a negative high-voltage external monitoring port. The configuration circuit includes a voltage supply circuit, a WL drive circuit, and a BL drive circuit. A positive output end of the voltage supply circuit is connected to the positive voltage ends of the WL drive circuit and the BL drive circuit, and a negative output end of the voltage supply circuit is connected to the negative voltage ends of the WL drive circuit and the BL drive circuit. In the voltage supply circuit of the flash FPGA:

An oscillator is connected to clock signal terminals of a positive high-voltage charge pump and a negative high-voltage charge pump through a mode control circuit, which further outputs a switch control signal to control on/off of a positive high-voltage bidirectional switch circuit and a negative high-voltage bidirectional switch circuit.

A positive high-voltage output terminal of the positive high-voltage charge pump is connected to the positive high-voltage external monitoring port through the positive high-voltage bidirectional switch circuit. The common end of the positive high-voltage charge pump and the positive high-voltage bidirectional switch circuit is configured as the positive output end of the voltage supply circuit.

A negative high-voltage output terminal of the negative high-voltage charge pump is connected to the negative high-voltage external monitoring port through the negative high-voltage bidirectional switch circuit. The common end of the negative high-voltage charge pump and the negative high-voltage bidirectional switch circuit is configured as the negative output end of the voltage supply circuit.

The mode control circuit obtains a mode adjustment signal based on a JTAG protocol of the flash FPGA and controls on/off of paths between the oscillator and the clock signal terminals of the two high-voltage charge pumps and on/off of the two high-voltage bidirectional switch circuits based on the obtained mode adjustment signal to control the flash FPGA to enter an external monitoring mode or an external configuration mode.

In the external monitoring mode, a positive high voltage provided by the positive high-voltage charge pump is externally monitored through the positive high-voltage external monitoring port, and a negative high voltage provided by the negative high-voltage charge pump is externally monitored through the negative high-voltage external monitoring port.

In the external configuration mode, an external positive high voltage is input through the positive high-voltage external monitoring port and output through the positive output end of the voltage supply circuit, and an external negative high voltage is input through the negative high-voltage external monitoring port and output through the negative output end of the voltage supply circuit.

Beneficial Effects

The present disclosure provides a configuration circuit of a flash FPGA for realizing external monitoring and configuration. Based on the structure of the configuration circuit in the present disclosure, only a small amount of logic needs to be added based on a JTAG protocol to monitor through a positive high-voltage external monitoring port and a negative high-voltage external monitoring port, positive and negative high voltages provided by internal high-voltage charge pumps during erasure and programming operations to discover abnormal positive and negative high voltages in time, and improve reliability.

In addition, the positive and negative high voltages can also be externally input through the positive and negative high-voltage external monitoring ports. When the positive and negative high voltages are externally input, the two high-voltage charge pumps are turned off to prevent a conflict with the externally provided high voltages. When it is determined that the positive and negative high voltages provided by the internal high-voltage charge pumps are abnormal during monitoring, required positive and negative voltages during the erasure and programming operations can be externally input to adjust the time ranges of positive and negative high voltages output to a WL drive circuit and a BL drive circuit to further improve the reliability.

DETAILED DESCRIPTION OF THE DRAWINGS

DETAILED DESCRIPTION OF THE EMBODIMENTS

Implementations of the Present Disclosure

The specific implementations of the present disclosure will be further described below with reference to the accompanying drawings.

The present disclosure provides a configuration circuit of a flash FPGA for realizing external monitoring and configuration. The flash FPGA further externally provides a positive high-voltage external monitoring port HV_PAD and a negative high-voltage external monitoring port LV_PAD.

Figure 1:
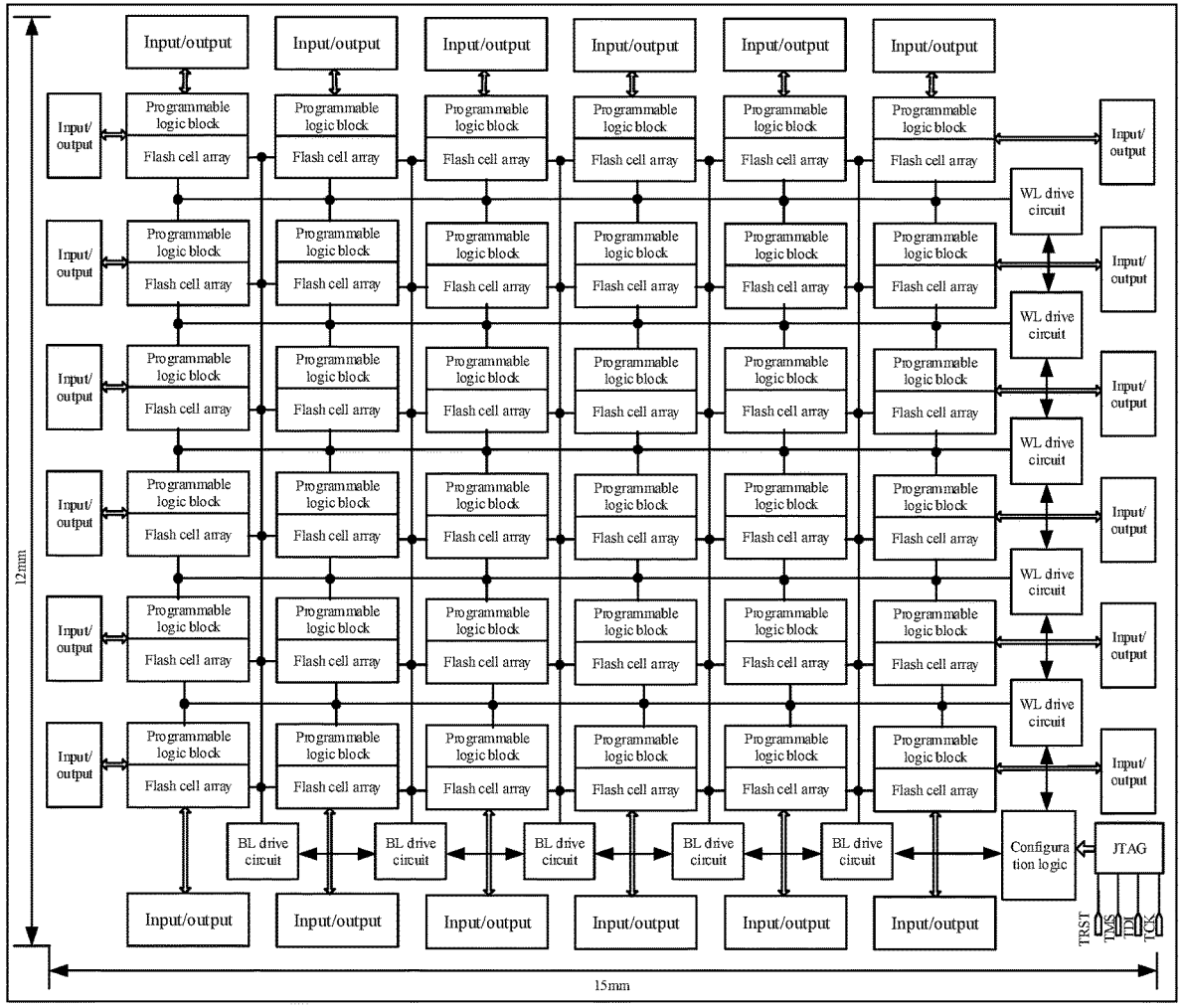
FIG. 1 is a schematic layout diagram of programmable logic blocks in a flash FPGA.
Figure 2:
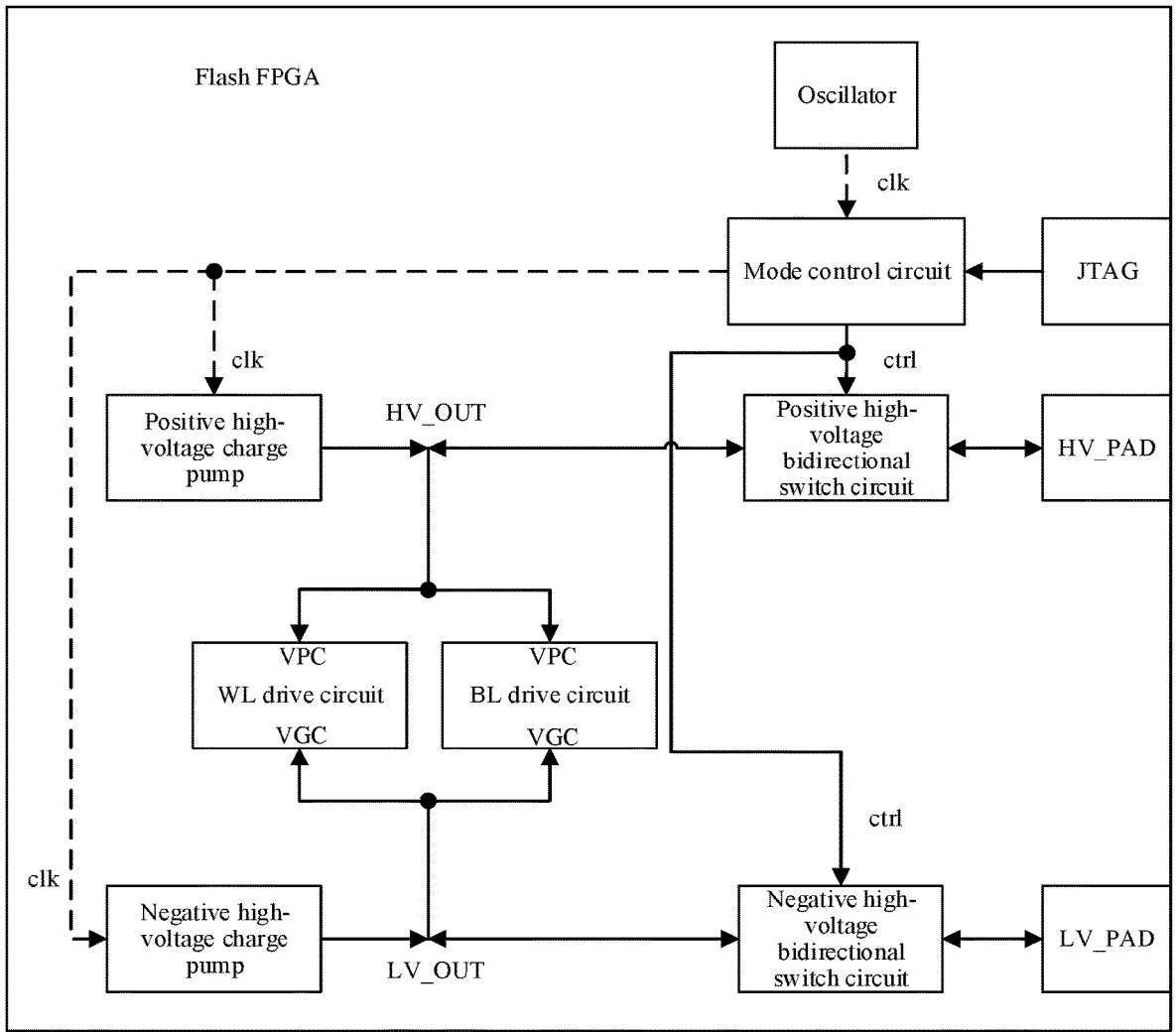
FIG. 2 is a schematic structural diagram of a configuration circuit according to the present disclosure.
Figure 3:
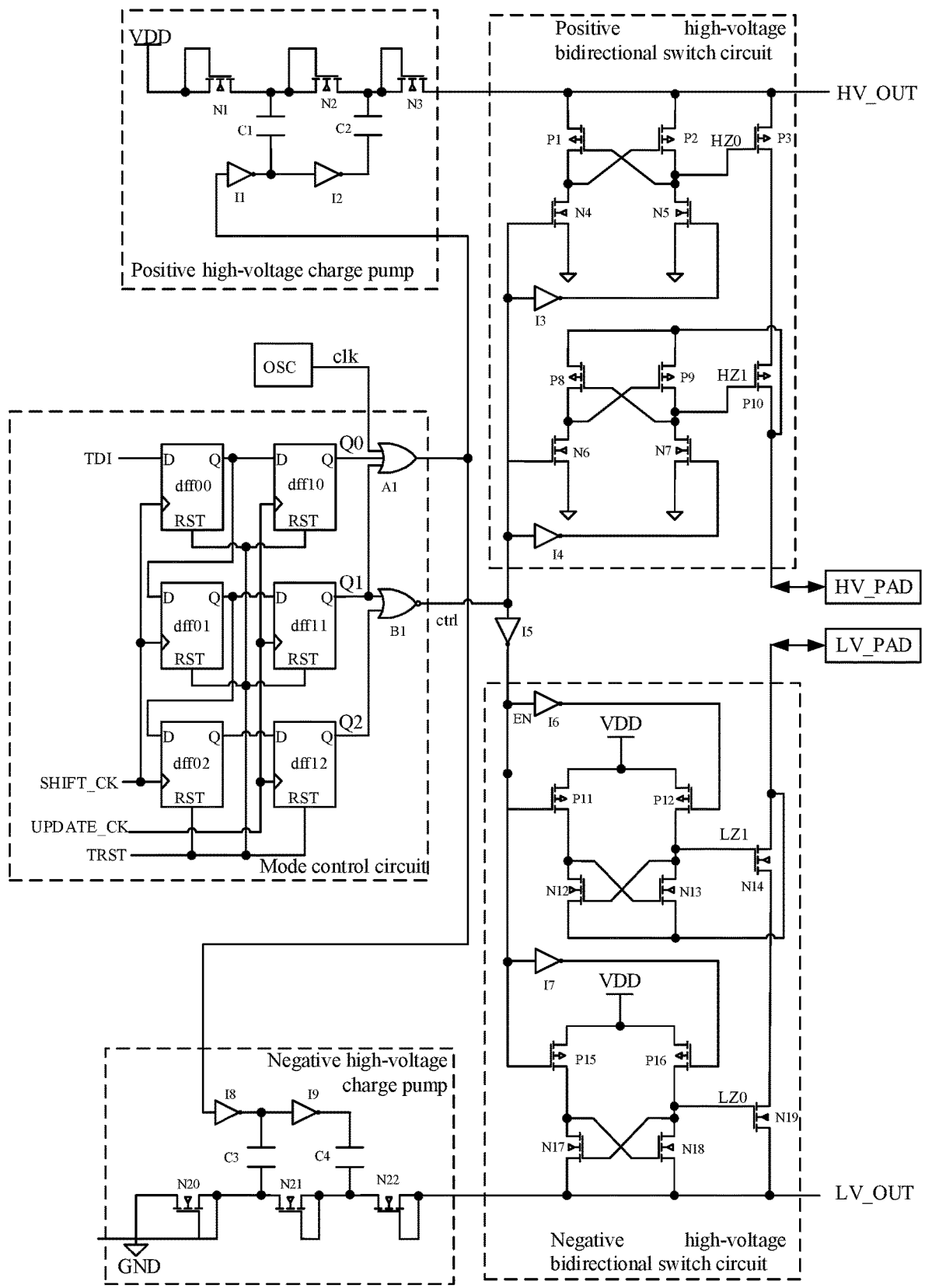
FIG. 3 is a circuit diagram of a voltage supply circuit according to an embodiment of the present disclosure.

Referring to FIG. 2, inside the flash FPGA, the configuration circuit includes a voltage supply circuit, a WL drive circuit, and a BL drive circuit. The positive output end HV_OUT of the voltage supply circuit is connected to the positive voltage ends VPC of the WL drive circuit and the BL drive circuit, and the negative output end LV_OUT of the voltage supply circuit is connected to the negative voltage ends VGC of the WL drive circuit and the BL drive circuit. The WL drive circuit and BL drive circuit may adopt an existing drive circuit structure, and details are not described in the present disclosure. The voltage supply circuit of the flash FPGA includes a mode control circuit, an oscillator OSC, a positive high-voltage charge pump, a negative high-voltage charge pump, a positive high-voltage bidirectional switch circuit, and a negative high-voltage bidirectional switch circuit. The positive high-voltage charge pump and the negative high-voltage charge pump may adopt an existing circuit structure. FIG. 3 shows a possible circuit structure as an example.

The positive high-voltage output terminal of the positive high-voltage charge pump is connected to the positive high-voltage external monitoring port HV_PAD through the positive high-voltage bidirectional switch circuit. The common end of the positive high-voltage charge pump and the positive high-voltage bidirectional switch circuit is configured as the positive output end HV_OUT of the voltage supply circuit. The negative high-voltage output terminal of the negative high-voltage charge pump is connected to the negative high-voltage external monitoring port LV_PAD through the negative high-voltage bidirectional switch circuit. The common end of the negative high-voltage charge pump and the negative high-voltage bidirectional switch circuit is configured as the negative output end LV_OUT of the voltage supply circuit.

The oscillator provides a clock signal clk. The oscillator is connected to the clock signal terminals of the positive high-voltage charge pump and the negative high-voltage charge pump through the mode control circuit. The mode control circuit further outputs a switch control signal ctrl to control on/off of the positive high-voltage bidirectional switch circuit and the negative high-voltage bidirectional switch circuit.

The mode control circuit obtains a mode adjustment signal based on a JTAG protocol of the flash FPGA and controls on/off of paths between the oscillator and the clock signal terminals of the positive high-voltage charge pump and the negative high-voltage charge pump and on/off of the positive high-voltage bidirectional switch circuit and the negative high-voltage bidirectional switch circuit based on the obtained mode adjustment signal to control the flash FPGA to enter an external monitoring mode, an external configuration mode, or a default working mode.

1. External monitoring mode. When the mode control circuit obtains a second mode adjustment signal for instructing the flash FPGA to enter the external monitoring mode, the mode control circuit controls the paths between the oscillator and the clock signal terminals of the positive high-voltage charge pump and the negative high-voltage charge pump to be turned on, and the oscillator normally provides the clock signal clk to the positive high-voltage charge pump and the negative high-voltage charge pump through the mode control circuit, such that the positive high-voltage charge pump and the negative high-voltage charge pump work normally. In this way, a positive high voltage provided by the positive high-voltage charge pump is provided to the WL drive circuit and the BL drive circuit through the positive output end HV_OUT of the voltage supply circuit, and a negative high voltage provided by the negative high-voltage charge pump is provided to the WL drive circuit and the BL drive circuit through the negative output end LV_OUT of the voltage supply circuit.

In addition, the mode control circuit further outputs a switch control signal ctrl with a valid level to control the positive high-voltage bidirectional switch circuit and the negative high-voltage bidirectional switch circuit to be turned on. The positive high voltage provided by the positive high-voltage charge pump also passes through the positive high-voltage bidirectional switch circuit and is output by the positive high-voltage external monitoring port HV_PAD, and the negative high voltage provided by the negative high-voltage charge pump also passes through the negative high-voltage bidirectional switch circuit and is output by the negative high-voltage external monitoring port LV_PAD.

This mode can be used to externally monitor the positive and negative high voltages to discover abnormal positive and negative high voltages in time and improve reliability.

2. External configuration mode. When the mode control circuit obtains a third mode adjustment signal for instructing the flash FPGA to enter the external configuration mode, the mode control circuit controls the paths between the oscillator and the clock signal terminals of the positive high-voltage charge pump and the negative high-voltage charge pump to be turned off, and the clock signal provided by the oscillator is turned off by the mode control circuit and cannot be transmitted to the positive high-voltage charge pump and the negative high-voltage charge pump, making both the positive high-voltage charge pump and the negative high voltage charge pump stop working.

In addition, the mode control circuit further outputs the switch control signal with the valid level to control the positive high-voltage bidirectional switch circuit and the negative high-voltage bidirectional switch circuit to be turned on. In this mode, the positive high-voltage external monitoring port HV_PAD inputs an external positive high voltage, and the negative high-voltage external monitoring port LV_PAD inputs an external negative high voltage. Therefore, the external positive high voltage input by the positive high-voltage external monitoring port HV_PAD is transmitted to the positive output end HV_OUT of the voltage supply circuit through the positive high-voltage bidirectional switch circuit and then provided to the WL drive circuit and the BL drive circuit. The external negative high voltage input by the negative high-voltage external monitoring port LV_PAD is transmitted to the negative output end LV_OUT of the voltage supply circuit through the negative high-voltage bidirectional switch circuit and then provided to the WL drive circuit and the BL drive circuit.

This mode can be used to externally input required positive and negative high voltages. When the required positive and negative high voltages are externally input, the two high-voltage charge pumps are turned off to prevent a conflict with the externally provided high voltages. In a typical application scenario, when it is monitored through the external monitoring mode that the positive and negative high voltages provided by the internal high-voltage charge pumps are abnormal, required positive and negative voltages during erasure and programming operations can be externally input to adjust in time ranges of positive and negative high voltages output to the WL drive circuit and the BL drive circuit.

3. Default working mode. When the mode control circuit obtains a first mode adjustment signal for instructing the flash FPGA to enter the default working mode, the mode control circuit controls the paths between the oscillator and the clock signal terminals of the positive high-voltage charge pump and the negative high-voltage charge pump to be turned on. The oscillator normally provides the clock signal clk to the positive high-voltage charge pump and the negative high-voltage charge pump through the mode control circuit, such that the positive high-voltage charge pump and the negative high-voltage charge pump work normally. In this way, the positive high voltage provided by the positive high-voltage charge pump is provided to the WL drive circuit and the BL drive circuit through the positive output end HV_OUT of the voltage supply circuit, and the negative high voltage provided by the negative high-voltage charge pump is provided to the WL drive circuit and the BL drive circuit through the negative output end LV_OUT of the voltage supply circuit. In addition, the mode control circuit outputs a switch control signal ctrl with an invalid level to control the positive high-voltage bidirectional switch circuit and the negative high-voltage bidirectional switch circuit to be turned off.

This mode is the same as the working process in which a high-voltage charge pump provides the required high voltage in an existing FPGA; in other words, the flash FPGA is also compatible with a conventional mode without external monitoring and configuration functions.

FIG. 3 shows a specific circuit diagram of a voltage supply circuit according to an embodiment.

(1) Mode Control Circuit.

The mode control circuit includes control logic, a three-input OR gate A1, and a two-input NOR gate B1. A first input terminal Q0 and a second input terminal Q1 of the control logic are respectively connected to two input terminals of the three-input OR gate A1. The oscillator is connected to another input terminal of the three-input OR gate A1. An output terminal of the three-input OR gate A1 is connected to the clock signal terminals of the positive high-voltage charge pump and the negative high-voltage charge pump.

The second input terminal Q1 and a third input terminal Q2 of the control logic are respectively connected to two input terminals of the two-input NOR gate B1. An output terminal of the two-input NOR gate B1 is connected to the positive high-voltage bidirectional switch circuit and the negative high-voltage bidirectional switch circuit to control on/off of the positive high-voltage bidirectional switch circuit and the negative high-voltage bidirectional switch circuit.

The mode control circuit obtains the mode adjustment signal through the control logic, and the control logic controls outputs of the three-input OR gate A1 and the two-input NOR gate B1 based on the obtained mode adjustment signal.

(a) When the mode control circuit obtains the first mode adjustment signal through the control logic, the first input terminal Q0, the second input terminal Q1, and the third input terminal Q2 are all at a low level, which is denoted as <Q0, Q1, Q2>=3'b000. In addition, the output terminal of the three-input OR gate A1 outputs the clock signal provided by the oscillator and the two-input NOR gate B1 outputs a switch control signal with an invalid high level to turn off the positive high-voltage bidirectional switch circuit and the negative high-voltage bidirectional switch circuit.

(b) When the mode control circuit obtains the second mode adjustment signal through the control logic, the first input terminal Q0 and the second input terminal Q1 are at a low level, and the third input terminal Q2 is at a high level, which is denoted as <Q0, Q1, Q2>=3'b001. In addition, the output terminal of the three-input OR gate A1 outputs the clock signal provided by the oscillator and the two-input NOR gate B1 outputs a switch control signal with a valid low level to turn on the positive high-voltage bidirectional switch circuit and the negative high-voltage bidirectional switch circuit.

(c) When the mode control circuit obtains the third mode adjustment signal through the control logic, the first input terminal Q0 and the second input terminal Q1 are at a high level, and the third input terminal Q2 is at a low level, which is denoted as <Q0, Q1, Q2>=3'b110. In this case, the output terminal of the three-input OR gate A1 constantly outputs the high level to turn off the clock signal provided by the oscillator. The two-input NOR gate B1 outputs the switch control signal with the valid low level to turn on the positive high-voltage bidirectional switch circuit and the negative high-voltage bidirectional switch circuit.

In an embodiment, the mode control circuit obtains the mode adjustment signal through a TDI terminal and a TRST terminal of the JTAG protocol of the flash FPGA, and the control logic includes three shift registers dff00, dff01, and dff02 and three control registers dff10, dff11, and dff12.

A D terminal of dff00 is connected to the TDI terminal, a Q terminal of dff00 is connected to a D terminal of dff10, and a Q terminal of dff10 is configured as the first input terminal Q0 of the control logic. The Q terminal of dff00 is further connected to a D terminal of dff01, a Q terminal of dff01 is connected to a D terminal of dff11, and a Q terminal of dff11 is configured as the second input terminal Q1 of the control logic. The Q terminal of dff01 is further connected to a D terminal of dff02, a Q terminal of dff02 is connected to a D terminal of dff12, and a Q terminal of dff12 is configured as the third input terminal Q2 of the control logic. RST terminals of dff00, dff01, dff02, dff10, dff11, and dff12 are all connected to the TRST terminal. CLK terminals of dff00, dff01, and dff02 are all connected to a data shift clock signal SHIFT_CK sent by a TAP state machine of the JTAG protocol of the flash FPGA, and CLK terminals of dff10, dff11, and dff12 are all connected to a data update clock signal UPDATE_CK sent by the TAP state machine of the JTAG protocol of the flash FPGA.

(2) Positive High-Voltage Bidirectional Switch Circuit

The positive high-voltage bidirectional switch circuit includes PMOS transistors P3 and P10, a first positive level conversion circuit, and a second positive level conversion circuit. A source of P3 is connected to the positive high-voltage output terminal of the positive high-voltage charge pump. A drain of P3 is connected to a source of P10, and a drain of P10 is connected to the positive high-voltage external monitoring port HV_PAD. The input end of the first positive level conversion circuit obtains the switch control signal ctrl output by the mode control circuit, an output end HZ0 of the first positive level conversion circuit is connected to a gate of P3, and a power supply end of the first positive level conversion circuit is connected to the positive high-voltage output terminal of the positive high-voltage charge pump. The input end of the second positive level conversion circuit obtains the switch control signal ctrl output by the mode control circuit, an output end HZ1 of the second positive level conversion circuit is connected to a gate of P10, and a power supply end of the second positive level conversion circuit is connected to the positive high-voltage external monitoring port HV_PAD.

When the mode control circuit outputs the switch control signal ctrl with the valid level, both the first positive level conversion circuit and the second positive level conversion circuit output the low level and both P3 and P10 are turned on, such that bidirectional transmission is enabled between the positive high-voltage external monitoring port HV_PAD and the positive output end HV_OUT, in other words, the positive high-voltage bidirectional switch circuit is turned on. When the mode control circuit outputs the switch control signal ctrl with the invalid level, both the first positive level conversion circuit and the second positive level conversion circuit output the high level, a voltage at the output end HZ0 of the first positive level conversion circuit is equal to the positive high voltage output by the positive high-voltage charge pump, and a voltage at the output end HZ1 of the second positive level conversion circuit is equal to a voltage of the positive high-voltage external monitoring port HV_PAD. In this way, a path between the positive high-voltage external monitoring port HV_PAD and the positive output end HV_OUT can be turned off, in other words, the positive high-voltage bidirectional switch circuit is turned off.

As described above, in FIG. 3, the low level of the switch control signal ctrl is valid, and the circuit structure of the first positive level conversion circuit is identical to the circuit structure of the second positive level conversion circuit. In each positive level conversion circuit, a source of a PMOS transistor P1 and a source of a PMOS transistor P2 are connected to each other and to the power supply end of the positive level conversion circuit. A drain of P1 is connected to a drain of an NMOS transistor N4 and a gate of P2, and a drain of P2 is connected to a drain of an NMOS transistor N5 and a gate of P1. A source of N4 is grounded, a source of N5 is grounded, a gate of N4 is connected to the input end of the positive level conversion circuit, the input end of the positive level conversion circuit is further connected to a gate of N5 through an inverter I3, and the drain of N5 is further connected to the output end of the positive level conversion circuit. For the purpose of differentiation, the first positive level conversion circuit is represented by P1, P2, N4, and N5, and the second positive level conversion circuit is represented by P8, P9, N6, and N7.

(3) Negative High-Voltage Bidirectional Switch Circuit

The negative high-voltage bidirectional switch circuit includes NMOS transistors N14 and N19, a first negative level conversion circuit, and a second negative level conversion circuit. A source of N19 is connected to the negative high-voltage output terminal of the negative high-voltage charge pump, a drain of N19 is connected to a source of N14, and a drain of N14 is connected to the negative high-voltage external monitoring port LV_PAD.

The switch control signal ctrl output by the mode control circuit is provided to an input end of the first negative level conversion circuit and an input end of the second negative level conversion circuit through an inverter I5. An output end LZ0 of the first negative level conversion circuit is connected to a gate of N19, and a power supply end of the first negative level conversion circuit is connected to the negative high-voltage output terminal of the negative high-voltage charge pump. An output end LZ1 of the second negative level conversion circuit is connected to a gate of N14, and a power supply end of the second negative level conversion circuit is connected to the negative high-voltage external monitoring port LV_PAD.

When the mode control circuit outputs the switch control signal ctrl with the valid level, both the first negative level conversion circuit and the second negative level conversion circuit output the high level and both N19 and N14 are turned on, such that bidirectional transmission is enabled between the negative high-voltage external monitoring port LV_PAD and the negative output end LV_OUT, in other words, the negative high-voltage bidirectional switch circuit is turned on. When the mode control circuit outputs the switch control signal ctrl with the invalid level, both the first negative level conversion circuit and the second negative level conversion circuit output the low level, a voltage at the output end LZ0 of the first negative level conversion circuit is equal to the negative high voltage output by the negative high-voltage charge pump, and a voltage at the output end LZ1 of the second negative level conversion circuit is equal to a voltage of the negative high-voltage external monitoring port LV_PAD. In this way, a path between the negative high-voltage external monitoring port LV_PAD and the negative output end LV_OUT can be turned off, in other words, the negative high-voltage bidirectional switch circuit is turned off.

As described above, in FIG. 3, the low level of the switch control signal ctrl is valid, and the circuit structure of the first negative level conversion circuit is identical to the circuit structure of the second negative level conversion circuit. In each negative level conversion circuit, a source of an NMOS transistor N12 and a source of an NMOS transistor N13 are connected to each other and to the power supply end of the negative level conversion circuit. A drain of N12 is connected to a drain of a PMOS transistor P11 and a gate of N13, and a drain of N13 is connected to a drain of a PMOS transistor P12 and a gate of N12. A source of P11 and a source of P12 are connected to each other and to a chip voltage VDD, and a gate of P11 is connected to the input end of the negative level conversion circuit. The input end of the negative level conversion circuit is further connected to a gate of P12 through an inverter, and the drain of N13 is configured as the output end of the negative level conversion circuit. For the purpose of differentiation, the second negative level conversion circuit is represented by P11, P12, N12, and N13, and the first negative level conversion circuit is represented by P15, P16, N17, and N18.

The above merely describes preferred implementations of the present disclosure, and the present disclosure is not limited to the above embodiments. It can be understood that improvements and modifications directly derived by those skilled in the art without departing from the spirit and concept of the present disclosure should be regarded as falling within the protection scope of the present disclosure.

What is claimed is:

1. A configuration circuit of a flash field programmable gate array (FPGA) for realizing external monitoring and configuration, wherein the flash FPGA comprises a positive high-voltage external monitoring port and a negative high-voltage external monitoring port; the configuration circuit comprises a voltage supply circuit, a word line (WL) drive circuit, and a bit line (BL) drive circuit, wherein a positive output end of the voltage supply circuit is connected to positive voltage ends of the WL drive circuit and the BL drive circuit, and a negative output end of the voltage supply circuit is connected to negative voltage ends of the WL drive circuit and the BL drive circuit; wherein in the voltage supply circuit of the flash FPGA:
  an oscillator is connected to clock signal terminals of a positive high-voltage charge pump and a negative high-voltage charge pump through a mode control circuit, and the mode control circuit further outputs a switch control signal to control on/off of a positive high-voltage bidirectional switch circuit and a negative high-voltage bidirectional switch circuit;
  a positive high-voltage output terminal of the positive high-voltage charge pump is connected to the positive high-voltage external monitoring port through the positive high-voltage bidirectional switch circuit, and a common end of the positive high-voltage charge pump and the positive high-voltage bidirectional switch circuit is configured as the positive output end of the voltage supply circuit;
  a negative high-voltage output terminal of the negative high-voltage charge pump is connected to the negative high-voltage external monitoring port through the negative high-voltage bidirectional switch circuit, and a common end of the negative high-voltage charge pump and the negative high-voltage bidirectional switch circuit is configured as the negative output end of the voltage supply circuit; and
  the mode control circuit obtains a mode adjustment signal based on a Joint Test Action Group (JTAG) protocol of the flash FPGA and controls on/off of paths between the oscillator and the clock signal terminals of the positive high-voltage charge pump and the negative high-voltage charge pump and on/off of the positive high-voltage bidirectional switch circuit and the negative high-voltage bidirectional switch circuit based on the mode adjustment signal to control the flash FPGA to enter an external monitoring mode or an external configuration mode, wherein
  in the external monitoring mode, a positive high voltage provided by the positive high-voltage charge pump is externally monitored through the positive high-voltage external monitoring port, and a negative high voltage provided by the negative high-voltage charge pump is externally monitored through the negative high-voltage external monitoring port; and
  in the external configuration mode, an external positive high voltage is input through the positive high-voltage external monitoring port and output through the positive output end of the voltage supply circuit, and an external negative high voltage is input through the negative high-voltage external monitoring port and output through the negative output end of the voltage supply circuit.

2. The configuration circuit according to claim 1, wherein when the mode control circuit obtains a second mode adjustment signal for instructing the flash FPGA to enter the external monitoring mode, the mode control circuit controls the paths between the oscillator and the clock signal terminals of the positive high-voltage charge pump and the negative high-voltage charge pump to be turned on and outputs a switch control signal with a valid level to control the positive high-voltage bidirectional switch circuit and the negative high-voltage bidirectional switch circuit to be turned on, wherein the positive high voltage provided by the positive high-voltage charge pump is output through the positive output end of the voltage supply circuit and the positive high-voltage external monitoring port, and the negative high voltage provided by the negative high-voltage charge pump is output through the negative output end of the voltage supply circuit and the negative high-voltage external monitoring port.

3. The configuration circuit according to claim 1, wherein when the mode control circuit obtains a third mode adjustment signal for instructing the flash FPGA to enter the external configuration mode, the mode control circuit controls the paths between the oscillator and the clock signal terminals of the positive high-voltage charge pump and the negative high-voltage charge pump to be turned off and outputs a switch control signal with a valid level to control the positive high-voltage bidirectional switch circuit and the negative high-voltage bidirectional switch circuit to be turned on, wherein the positive high-voltage charge pump and the negative high-voltage charge pump stop working, the external positive high voltage input by the positive high-voltage external monitoring port is output through the positive output end of the voltage supply circuit, and the external negative high voltage input by the negative high-voltage external monitoring port is output through the negative output end of the voltage supply circuit.

4. The configuration circuit according to claim 1, wherein the mode control circuit comprises control logic, a three-input OR gate A1, and a two-input NOR gate B1;
  a first input terminal Q0 and a second input terminal Q1 of the control logic are respectively connected to two input terminals of the three-input OR gate A1, the oscillator is connected to another input terminal of the three-input OR gate A1, and an output terminal of the three-input OR gate A1 is connected to the clock signal terminals of the positive high-voltage charge pump and the negative high-voltage charge pump;
  the second input terminal Q1 and a third input terminal Q2 of the control logic are respectively connected to two input terminals of the two-input NOR gate B1, and an output terminal of the two-input NOR gate B1 is connected to the positive high-voltage bidirectional switch circuit and the negative high-voltage bidirectional switch circuit to control on/off of the positive high-voltage bidirectional switch circuit and the negative high-voltage bidirectional switch circuit;
  when the mode control circuit obtains, through the control logic, a second mode adjustment signal for instructing the flash FPGA to enter the external monitoring mode, the first input terminal Q0 and the second input terminal Q1 of the control logic output a low level, the third input terminal Q2 of the control logic outputs a high level, the output terminal of the three-input OR gate A1 outputs a clock signal provided by the oscillator, and the two-input NOR gate B1 outputs a switch control signal with a valid low level to turn on the positive high-voltage bidirectional switch circuit and the negative high-voltage bidirectional switch circuit; and when the mode control circuit obtains, through the control logic, a third mode adjustment signal for instructing the flash FPGA to enter the external configuration mode, the first input terminal Q0 and the second input terminal Q1 of the control logic output a high level, the third input terminal Q2 of the control logic outputs a low level, the output terminal of the three-input OR gate A1 constantly outputs a high level to turn off the clock signal provided by the oscillator, and the two-input NOR gate B1 outputs the switch control signal with the valid low level to turn on the positive high-voltage bidirectional switch circuit and the negative high-voltage bidirectional switch circuit.

5. The configuration circuit according to claim 4, wherein the mode control circuit obtains the mode adjustment signal through a TDI terminal and a TRST terminal of the JTAG protocol of the flash FPGA, and the control logic comprises a shift register dff00, a shift register dff01, a shift register dff02, a control register dff10, a control register dff11, and a control register dff12, wherein a D terminal of the shift register dff00 is connected to the TDI terminal, a Q terminal of the shift register dff00 is connected to a D terminal of the control register dff10, and a Q terminal of the control register dff10 is configured as the first input terminal Q0 of the control logic; the Q terminal of the shift register dff00 is further connected to a D terminal of the shift register dff01, a Q terminal of the shift register dff01 is connected to a D terminal of the control register dff11, and a Q terminal of the control register dff11 is configured as the second input terminal Q1 of the control logic; the Q terminal of the shift register dff01 is further connected to a D terminal of the shift register dff02, a Q terminal of the shift register dff02 is connected to a D terminal of the control register dff12, and a Q terminal of the control register dff12 is configured as the third input terminal Q2 of the control logic; and RST terminals of the shift register dff00, the shift register dff01, the shift register dff02, the control register dff10, the control register dff11, and the control register dff12 are connected to the TRST terminal; and CLK terminals of the shift register dff00, the shift register dff01, and the shift register dff02 are connected to a data shift clock signal SHIFT_CK sent by a TAP state machine of the JTAG protocol of the flash FPGA, and CLK terminals of the control register dff10, the control register dff11, and the control register dff12 are connected to a data update clock signal UPDATE_CK sent by the TAP state machine of the JTAG protocol of the flash FPGA.

6. The configuration circuit according to claim 1, wherein the positive high-voltage bidirectional switch circuit comprises a positive channel metal oxide semiconductor (PMOS) transistor P3, a PMOS transistor P10, a first positive level conversion circuit, and a second positive level conversion circuit, wherein a source of the PMOS transistor P3 is connected to the positive high-voltage output terminal of the positive high-voltage charge pump, a drain of the PMOS transistor P3 is connected to a source of the PMOS transistor P10, and a drain of the PMOS transistor P10 is connected to the positive high-voltage external monitoring port;

an input end of the first positive level conversion circuit obtains the switch control signal output by the mode control circuit, an output end of the first positive level conversion circuit is connected to a gate of the PMOS transistor P3, and a power supply end of the first positive level conversion circuit is connected to the positive high-voltage output terminal of the positive high-voltage charge pump;

an input end of the second positive level conversion circuit obtains the switch control signal output by the mode control circuit, an output end of the second positive level conversion circuit is connected to a gate of the PMOS transistor P10, and a power supply end of the second positive level conversion circuit is connected to the positive high-voltage external monitoring port; and when the mode control circuit outputs a switch control signal with a valid level, the first positive level conversion circuit and the second positive level conversion circuit output a low level and the PMOS transistor P3 and the PMOS transistor P10 are turned on, such that the positive high-voltage bidirectional switch circuit is turned on; otherwise the positive high-voltage bidirectional switch circuit is turned off.

7. The configuration circuit according to claim 6, wherein a low level of the switch control signal is valid; a circuit structure of the first positive level conversion circuit is identical to a circuit structure of the second positive level conversion circuit; and in each positive level conversion circuit of the the first positive level conversion circuit and the second positive level conversion circuit, a source of a PMOS transistor P1 and a source of a PMOS transistor P2 are connected to each other and to the power supply end of the each positive level conversion circuit, a drain of the PMOS transistor P1 is connected to a drain of a negative channel metal oxide semiconductor (NMOS) transistor N4 and a gate of the PMOS transistor P2, a drain of the PMOS transistor P2 is connected to a drain of an NMOS transistor N5 and a gate of the PMOS transistor P1, a source of the NMOS transistor N4 is grounded, a source of the NMOS transistor N5 is grounded, a gate of the NMOS transistor N4 is connected to the input end of the each positive level conversion circuit, the input end of the each positive level conversion circuit is further connected to a gate of the NMOS transistor N5 through an inverter I3, and the drain of the NMOS transistor N5 is further connected to the output end of the each positive level conversion circuit.

8. The configuration circuit according to claim 1, wherein the negative high-voltage bidirectional switch circuit comprises an NMOS transistor N14, an NMOS transistor N19, a first negative level conversion circuit, and a second negative level conversion circuit, wherein a source of the NMOS transistor N19 is connected to the negative high-voltage output terminal of the negative high-voltage charge pump, a drain of the NMOS transistor N19 is connected to a source of the NMOS transistor N14, and a drain of the NMOS transistor N14 is connected to the negative high-voltage external monitoring port;

the switch control signal output by the mode control circuit is provided to an input end of the first negative level conversion circuit and an input end of the second negative level conversion circuit through a first inverter, an output end of the first negative level conversion circuit is connected to a gate of the NMOS transistor N19, and a power supply end of the first negative level conversion circuit is connected to the negative high-voltage output terminal of the negative high-voltage charge pump;

an output end of the second negative level conversion circuit is connected to a gate of the NMOS transistor N14, and a power supply end of the second negative level conversion circuit is connected to the negative high-voltage external monitoring port; and when the mode control circuit outputs a switch control signal with a valid level, the first negative level conversion circuit and the second negative level conversion circuit output a high level and the NMOS transistor N19 and the NMOS transistor N14 are turned on, such that the negative high-voltage bidirectional switch circuit is turned on; otherwise the negative high-voltage bidirectional switch circuit is turned off.

9. The configuration circuit according to claim 8, wherein a low level of the switch control signal is valid; a circuit structure of the first negative level conversion circuit is identical to a circuit structure of the second negative level conversion circuit; and in each negative level conversion circuit of the first negative level conversion circuit and the second negative level conversion circuit, a source of an NMOS transistor N12 and a source of an NMOS transistor N13 are connected to each other and to the power supply end of the each negative level conversion circuit, a drain of the NMOS transistor N12 is connected to a drain of a PMOS transistor P11 and a gate of the NMOS transistor N13, a drain of the NMOS transistor N13 is connected to a drain of a PMOS transistor P12 and a gate of the NMOS transistor N12, a source of the PMOS transistor P11 and a source of the PMOS transistor P12 are connected to each other and to a chip voltage VDD, a gate of the PMOS transistor P11 is connected to the input end of the each negative level conversion circuit, the input end of the each negative level conversion circuit is further connected to a gate of the PMOS transistor P12 through a second inverter, and the drain of the NMOS transistor N13 is configured as the output end of the each negative level conversion circuit.

10. The configuration circuit according to claim 1, wherein when the mode control circuit obtains a first mode adjustment signal for instructing the flash FPGA to enter a default working mode, the mode control circuit controls the paths between the oscillator and the clock signal terminals of the positive high-voltage charge pump and the negative high-voltage charge pump to be turned on and outputs a switch control signal with an invalid level to control the positive high-voltage bidirectional switch circuit and the negative high-voltage bidirectional switch circuit to be turned off, the positive high voltage provided by the positive high-voltage charge pump is output through the positive output end of the voltage supply circuit, and the negative high voltage provided by the negative high-voltage charge pump is output through the negative output end of the voltage supply circuit.

* * * * *